(12) United States Patent
Kanatake

(10) Patent No.: US 12,310,132 B2
(45) Date of Patent: May 20, 2025

(54) SEMICONDUCTOR PACKAGE, SEMICONDUCTOR PACKAGE MANUFACTURING METHOD, AND ELECTRONIC DEVICE

(71) Applicant: SONY SEMICONDUCTOR SOLUTIONS CORPORATION, Kanagawa (JP)

(72) Inventor: Mitsuhito Kanatake, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 745 days.

(21) Appl. No.: 17/608,803

(22) PCT Filed: Feb. 26, 2020

(86) PCT No.: PCT/JP2020/007661
§ 371 (c)(1),
(2) Date: Nov. 4, 2021

(87) PCT Pub. No.: WO2020/230404
PCT Pub. Date: Nov. 19, 2020

(65) Prior Publication Data
US 2022/0254824 A1     Aug. 11, 2022

(30) Foreign Application Priority Data

May 15, 2019   (JP) .................................. 2019-092102

(51) Int. Cl.
*H10F 39/00*      (2025.01)
*H01L 21/56*      (2006.01)
*H01L 23/00*      (2006.01)

(52) U.S. Cl.
CPC ........... *H10F 39/804* (2025.01); *H01L 21/56* (2013.01); *H01L 24/48* (2013.01); *H10F 39/811* (2025.01);
(Continued)

(58) Field of Classification Search
CPC ... H01L 27/14618; H01L 21/56; H01L 24/48; H01L 27/14636; H01L 27/14634;
(Continued)

(56) References Cited

U.S. PATENT DOCUMENTS

2001/0020738 A1*  9/2001  Iizima ............... H01L 27/14623
                                                           257/680
2002/0149075 A1   10/2002 Izima et al.
(Continued)

FOREIGN PATENT DOCUMENTS

CN         1967853 A        5/2007
CN       101689533 A        3/2010
(Continued)

OTHER PUBLICATIONS

International Search Report and Written Opinion of PCT Application No. PCT/JP2020/007661, issued on Apr. 7, 2020, 11 pages of ISRWO.

*Primary Examiner* — Robert G Bachner
(74) *Attorney, Agent, or Firm* — CHIP LAW GROUP

(57) ABSTRACT

To arrange a protective material horizontally with respect to a substrate plane without the protective material coming into contact with wires in a wire-bonded semiconductor package. The semiconductor package includes a protective material, a substrate, bumps, and a semiconductor chip. The bumps are provided on a chip plane of the semiconductor chip and are connected to the substrate via wires. The semiconductor chip is laminated on the substrate. A support is provided on the chip plane to support the protective material at a position
(Continued)

where the height from the chip plane of the semiconductor chip is higher than the bumps.

15 Claims, 17 Drawing Sheets

(52) U.S. Cl.
CPC ............... *H01L 2224/48228* (2013.01); *H01L 2224/48453* (2013.01); *H01L 2224/48463* (2013.01); *H01L 2924/182* (2013.01); *H01L 2924/18301* (2013.01); *H01L 2924/186* (2013.01); *H10F 39/809* (2025.01)

(58) Field of Classification Search
CPC . H01L 2224/48228; H01L 2224/48453; H01L 2224/48463; H01L 2924/182; H01L 2924/18301; H01L 2924/186; H01L 21/561; H01L 24/85; H01L 24/97; H01L 24/06; H01L 24/32; H01L 24/73; H01L 2224/06135; H01L 2224/85051; H01L 2224/85186; H01L 2924/14; H01L 2924/16195; H01L 24/49; H01L 2224/05554; H01L 2224/32225; H01L 2224/48227; H01L 2224/48471; H01L 2224/48479; H01L 2224/49175; H01L 2224/73265; H01L 2224/97; H01L 2924/00014; H01L 2924/15311; H01L 2924/16235; H01L 2924/16588; H01L 2924/181

See application file for complete search history.

(56) References Cited

U.S. PATENT DOCUMENTS

| | | |
|---|---|---|
| 2004/0119118 A1* | 6/2004 | Williams ................ H01L 24/49 257/E23.044 |
| 2007/0108578 A1 | 5/2007 | Watanabe |
| 2010/0102437 A1 | 4/2010 | Suto |
| 2012/0052628 A1 | 3/2012 | Kuroda |
| 2013/0056880 A1* | 3/2013 | Wang .................... H01L 23/145 257/777 |
| 2014/0063764 A1 | 3/2014 | Tanaka et al. |

FOREIGN PATENT DOCUMENTS

| | | |
|---|---|---|
| CN | 102386112 A | 3/2012 |
| EP | 1786033 A2 | 5/2007 |
| EP | 2164098 A1 | 3/2010 |
| JP | 2001-257334 A | 9/2001 |
| JP | 2002-076154 A | 3/2002 |
| JP | 2004-253693 A | 9/2004 |
| JP | 2007-141957 A | 6/2007 |
| JP | 2009-010261 A | 1/2009 |
| JP | 2012-054264 A | 3/2012 |
| JP | 2012-169528 A | 9/2012 |
| JP | 2014-049477 A | 3/2014 |
| JP | 2019-040893 A | 3/2019 |
| JP | 2019-050338 A | 3/2019 |
| KR | 10-0681781 B1 | 2/2007 |
| KR | 10-2010-0025538 A | 3/2010 |
| KR | 10-2012-0021278 A | 3/2012 |
| WO | 2009/005017 A1 | 1/2009 |
| WO | 2019/039278 A1 | 2/2019 |
| WO | 2019/054177 A1 | 3/2019 |

* cited by examiner

SEMICONDUCTOR PACKAGE, SEMICONDUCTOR PACKAGE MANUFACTURING METHOD, AND ELECTRONIC DEVICE

CROSS REFERENCE TO RELATED APPLICATIONS

This application is a U.S. National Phase of International Patent Application No. PCT/JP2020/007661 filed on Feb. 26, 2020, which claims priority benefit of Japanese Patent Application No. JP 2019-092102 filed in the Japan Patent Office on May 15, 2019. Each of the above-referenced applications is hereby incorporated herein by reference in its entirety.

TECHNICAL FIELD

The present technology relates to semiconductor packages. More specifically, the present invention relates to a semiconductor package in which a semiconductor chip is protected by a protective material, a method for manufacturing the semiconductor package, and an electronic device.

BACKGROUND ART

Conventionally, for the purpose of facilitating the handling of semiconductor integrated circuits, a semiconductor package in which a semiconductor chip provided with the semiconductor integrated circuit is mounted on a substrate and sealed has been used. For example, a semiconductor package having a structure in which a semiconductor chip is electrically connected to a substrate by wires and a protective material such as a cover glass and the semiconductor chip are bonded to each other using a resin such as an ultraviolet-curable resin has been proposed (for example, see PTL 1).

CITATION LIST

Patent Literature

[PTL 1]
  JP 2002-076154 A

SUMMARY

Technical Problem

In the above-mentioned semiconductor package, a resin before curing is applied around a solid-state image sensor in the semiconductor chip, a protective material (cover glass or the like) is placed, and the resin is cured by ultraviolet rays or the like to seal the semiconductor chip. However, since the resin before curing is liquid, the surface of the protective material placed on the resin in that state may be inclined instead of being horizontal with respect to the substrate plane.

When the protective material is a cover glass, if the surface is inclined with respect to the substrate plane, the light incident on the cover glass may be refracted, and the image captured by the solid-state image sensor may be distorted due to the refraction of the light, resulting in deterioration in image quality. If the resin is applied thinly such that wires are in contact with the protective material, the protective material can be arranged horizontally with respect to the substrate plane, but the wires may be damaged by coming into contact with the protective material. As described above, in the above-mentioned semiconductor package, it is difficult to arrange the protective material horizontally with respect to the substrate plane without the protective material coming into contact with the wires.

The present technology has been made in view of the above-described problems and an object thereof is arrange a protective material horizontally with respect to a substrate plane without the protective material coming into contact with wires in a wire-bonded semiconductor package.

Solution to Problem

The present technology has been made to solve the above-mentioned problems, and a first aspect thereof provides a semiconductor package including: a substrate; a semiconductor chip laminated on the substrate; bumps provided on a chip plane of the semiconductor chip and connected to the substrate via wires; a protective material; and a support provided on the chip plane to support the protective material at a position where a height from the chip plane is higher than the bumps.

This has an effect that the protective material is horizontally supported at a position where it does not come into contact with the wires.

In the first aspect, electrodes may be provided on each of the protective material and the semiconductor chip, and the support may be connected to the electrodes.

This has an effect that the performance of dissipating the heat generated by the semiconductor chip is improved.

In the first aspect, a recess may be provided in the protective material and one end of the support may be fitted into the recess. This has an effect that the misalignment of the protective material is suppressed.

In the first aspect, the semiconductor chip may further include an adhesive for bonding the protective material to the semiconductor chip. This has an effect that the protective material is bonded to the semiconductor chip.

In the first aspect, the adhesive may be an ultraviolet-curable resin. This has an effect that the protective material is bonded to the semiconductor chip by irradiation with ultraviolet rays.

In the first aspect, the adhesive may be a thermosetting resin. This has an effect that the protective material is bonded to the semiconductor chip by heat treatment.

In the first aspect, the support may be a laminated bump in which a plurality of bumps different from the bumps is laminated. This has an effect that the manufacturing cost is reduced.

In the first aspect, the support may be a solder ball. This has an effect that the manufacturing cost is reduced.

In the first aspect, the support may be a copper post. This has an effect that the height accuracy of the support is improved.

In the first aspect, the support may be a dry film. This has an effect that the height accuracy of the support is improved.

In the first aspect, the protective material may be a cover glass and a solid-state image sensor for capturing image data may be further provided on the chip plane.

This has an effect that image data is captured.

A second aspect of the present technology provides a semiconductor package manufacturing method including: a connection procedure of connecting a substrate to bumps provided on a chip plane of a semiconductor chip laminated on the substrate; a support arrangement procedure of forming a support that supports a protective material at a position where a height from the chip plane is higher than the bumps on the chip plane; and a protective material arrangement procedure of arranging the protective material. This has an effect that a semiconductor package in which a protective material is horizontally supported at a position where it does not come into contact with the wire.

In the second aspect, the method may further include an application procedure of applying an ultraviolet-curable resin around a semiconductor integrated circuit on the chip plane after the support is formed, in which in the support arrangement procedure, the protective material is arranged after the ultraviolet-curable resin is applied to cure the ultraviolet-curable resin. This has an effect that the protective material is bonded to the semiconductor chip by irradiation with ultraviolet rays.

In the second aspect, the method may further include an application procedure of applying a thermosetting resin around a semiconductor integrated circuit on the chip plane after the support is arranged. This has an effect that the protective material is bonded to the semiconductor chip by heat treatment.

A second aspect of the present technology provides an electronic device including: a substrate; a semiconductor chip laminated on the substrate; bumps provided on a chip plane of the semiconductor chip and connected to the substrate via wires; a protective material; a support provided on the chip plane to support the protective material at a position where a height from the chip plane is higher than the bumps; and a signal processing circuit that processes signals generated by the semiconductor integrated circuit. This has an effect that signals are processed in a semiconductor package in which a protective material is horizontally supported at a position where it does not come into contact with wires.

DESCRIPTION OF EMBODIMENTS

Hereinafter, modes for carrying out the present technology (hereinafter referred to as embodiments) will be described. The explanation will be given in the following order.

1. First Embodiment (Example of forming support on semiconductor chip)
2. Second Embodiment (Example of forming support on semiconductor chip and connecting support to electrodes)
3. Third Embodiment (Example of forming support on semiconductor chip and fitting support into recess)
4. Application Example to Moving Body 1. First Embodiment

[Configuration Example of Electronic Device]

Figure 1:
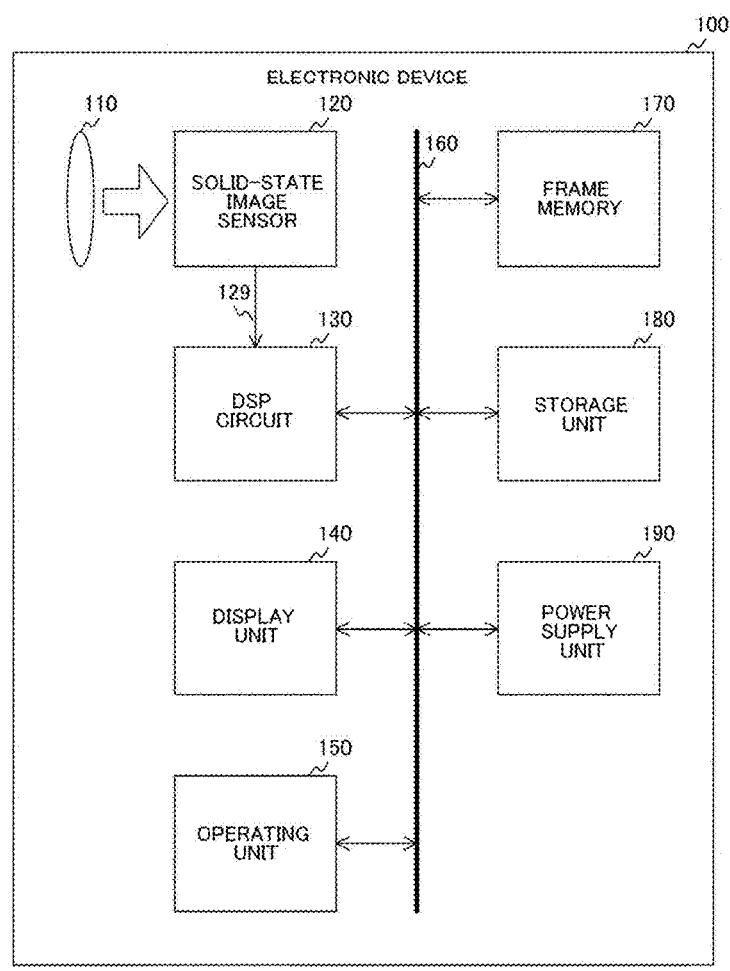
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 is a device for capturing image data, and includes an optical unit 110, a solid-state image sensor 120, and a DSP (Digital Signal Processing) circuit 130. The electronic device 100 further includes a display unit 140, an operating unit 150, a bus 160, a frame memory 170, a storage unit 180, and a power supply unit 190. As the electronic device 100, for example, in addition to a digital camera such as a digital still camera, a smartphone, a personal computer, an in-vehicle camera, or the like may be used.

The optical unit 110 collects the light from a subject and guides the light to the solid-state image sensor 120. The solid-state image sensor 120 generates image data by photoelectric conversion in synchronization with a vertical synchronization signal. The vertical synchronization signal is a periodic signal having a predetermined frequency indicating the imaging timing. The solid-state image sensor 120 supplies the generated image data to the DSP circuit 130.

The DSP circuit 130 executes predetermined signal processing on the image data from the solid-state image sensor 120. The DSP circuit 130 outputs the processed image data to the frame memory 170 or the like via the bus 160. The DSP circuit 130 is an example of a signal processing circuit described in the claims.

The display unit 140 displays image data. As the display unit 140, for example, a liquid crystal panel or an organic EL (Electro Luminescence) panel may be used. The operating unit 150 generates an operation signal according to the operation of the user.

The bus 160 is a common route for the optical unit 110, the solid-state image sensor 120, the DSP circuit 130, the display unit 140, the operating unit 150, the frame memory 170, the storage unit 180, and the power supply unit 190 to exchange data with each other.

The frame memory 170 holds image data. The storage unit 180 stores various kinds of data such as image data. The power supply unit 190 supplies power to the solid-state image sensor 120, the DSP circuit 130, the display unit 140, and the like.

In the above configuration, for example, the solid-state image sensor 120 and the DSP circuit 130 are mounted in a semiconductor package.

Configuration Example of Semiconductor Package

Figure 2A:
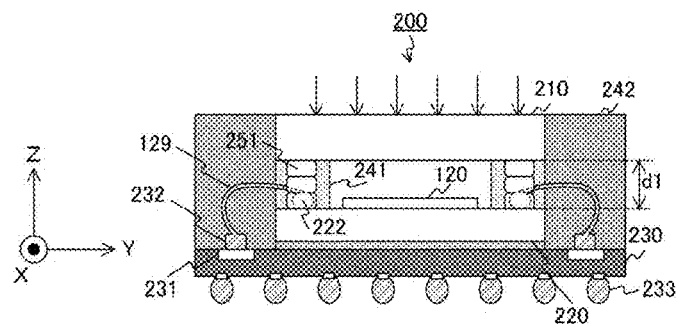
FIGS. 2A and 2B are examples of a cross-sectional view and a top view of a semiconductor package according to the first embodiment of the present technology.
Figure 2B:
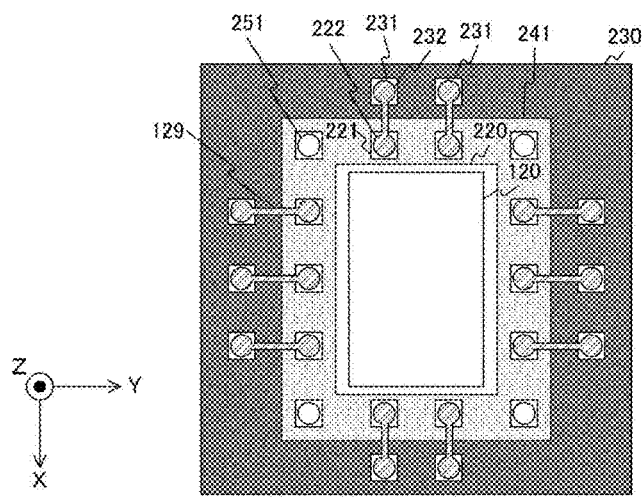

FIGS. 2A and 2B are examples of a cross-sectional view and a top view of a semiconductor package 200 according to the first embodiment of the present technology. FIG. 2A is an example of a cross-sectional view of the semiconductor package 200, and FIG. 2B is an example of a top view of the semiconductor package 200.

As illustrated in FIG. 2A, a cover glass 210, a semiconductor chip 220, and a circuit substrate 230 are arranged in the semiconductor package 200.

Hereinafter, the direction perpendicular to the substrate plane of the circuit substrate 230 is referred to as the "Z direction", and a predetermined direction parallel to the substrate plane is referred to as the "X direction". The direction perpendicular to the X direction and the Z direction is referred to as the "Y direction". FIG. 2A is a cross-sectional view seen from the X direction.

The cover glass 210 protects the semiconductor chip 220. Light from the optical unit 110 is incident on one of both sides of the cover glass 210. The arrows in the drawing indicate the incident direction of light. Hereinafter, the direction from the circuit substrate 230 to the optical unit 110 is referred to as an upward direction. The cover glass 210 is an example of a protective material described in the claims.

A plurality of bumps 232 is provided on the upper surface of the circuit substrate 230, and a plurality of solder balls 233 is provided on the lower surface. For example, the DSP circuit 130 (not illustrated) is arranged on the circuit substrate 230. The circuit substrate 230 is an example of a substrate described in the claims.

The semiconductor chip 220 is laminated on the circuit substrate 230. The upper surface of the semiconductor chip 220 is used as a chip plane, and the plurality of bumps 222, a plurality of supports 251, the solid-state image sensor 120, and an adhesive 241 are provided on the chip plane. In the substrate plane of the circuit substrate 230, the peripheries of the cover glass 210 and the semiconductor chip 220 are sealed with a sealing resin 242.

As illustrated in "b" in the drawing, the adhesive 241 is applied around the solid-state image sensor 120 on the upper surface (that is, the chip plane) of the semiconductor chip 220, and a plurality of lands 221 is arranged. The bumps 222 are provided on some portions of these lands 221 and the supports 251 are provided on the remaining portions. The supports 251 are arranged at four corners of the chip plane, for example. The heights of the supports 251 at these four corners are set to be the same. In "b" in the drawing, the cover glass 210 and the sealing resin 242 are omitted for convenience of description.

The adhesive 241 bonds the cover glass 210 and the semiconductor chip 220. As the adhesive 241, for example, an ultraviolet-curable resin is used. The adhesive 241 and the support 251 around the solid-state image sensor 120 form a closed space between the cover glass 210 and the solid-state image sensor 120. In other words, the semiconductor package 200 has a hollow structure.

On the upper surface of the circuit substrate 230, a plurality of lands 231 is arranged around the semiconductor chip 220. The bumps 232 are provided on these lands 231, respectively. The bumps 232 are electrically connected to the circuit (such as the DSP circuit 130) of the circuit substrate 230.

The bumps 232 on the circuit substrate 230 side are connected to the bumps 222 on the semiconductor chip 220 side via wires 129. That is, the semiconductor chip 220 is mounted on the circuit substrate 230 by wire bonding. The bumps 222 are electrically connected to the solid-state image sensor 120 on the semiconductor chip 220.

The supports 251 are members that support the cover glass 210, and are realized by a laminated bump in which a plurality of bumps is laminated. Due to the lamination of bumps, the height of the support 251 from the chip plane is higher than that of one stage of the bumps 222. By manufacturing the support 251 by laminating the bumps, the support 251 can be manufactured by the same process as when manufacturing the bumps 222 for wire bonding. As a result, the manufacturing cost can be reduced as compared with a case where the support 251 is manufactured by a process different from that of the bumps 222.

By changing the number of bump stages, the distance d1 between the semiconductor chip 220 and the cover glass 210 can be easily changed. For example, the distance d1 can be set to 100 μm or more.

As described above, the semiconductor chip 220 is laminated on the circuit substrate 230, and the bumps 222, the solid-state image sensor 120, and the supports 251 are provided on the chip plane. The bumps 222 are connected to the circuit substrate 230 via the wires 129, and are also connected to the solid-state image sensor 120. The circuit substrate 230 is connected to an external circuit of the semiconductor package 200 via the solder balls 233. Since the supports 251 are higher than the bumps 222, the cover glass 210 can be supported at a position higher than the bumps 222.

By the supports 251 supporting the cover glass 210 at a position higher than the bumps 222, the cover glass 210 can be arranged without the cover glass 210 coming into contact with the wires 129. Since the heights of the supports 251 at the four corners are the same, the surface of the cover glass 210 is horizontal to the substrate plane of the circuit substrate 230.

Since the cover glass 210 does not come into contact with the wire 129, it is possible to prevent noise from being generated in an electrical signal (image data or the like) due to damage to the wires 129 and an increase in stress on the wires 129. By raising the support 251 sufficiently so that the cover glass 210 and the semiconductor chip 220 are separated from each other, even if there is an obstruction such as dust on the cover glass 210, the obstruction on an image can be made smaller and deterioration of image quality can be suppressed.

Figure 3:
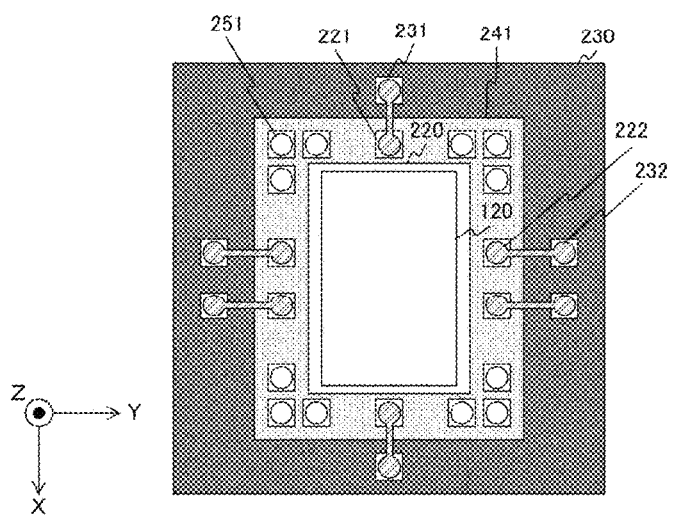
FIG. 3 is an example of a top view of a semiconductor package in which a support is added according to the first embodiment of the present technology.

The supports 251 are arranged at the four corners of the chip plane, but the arrangement is not limited thereto. For example, as illustrated in FIG. 3, the supports 251 may be arranged along the sides of the semiconductor chip 220 in addition to the four corners. By increasing the number of supports 251, it is possible to more reliably eliminate the inclination of the cover glass 210. The supports 251 may not be arranged at the four corners, and the supports 251 may be arranged around the solid-state image sensor 120 other than the four corners.

The solid-state image sensor 120 is arranged on the semiconductor chip 220, but the configuration is not limited thereto. A semiconductor integrated circuit other than the solid-state image sensor 120, such as a ToF (Time of Flight) sensor, may be arranged on the semiconductor chip 220. The solid-state image sensor 120 is an example of a semiconductor integrated circuit described in the claims.

Although the semiconductor chip 220 is protected by the cover glass 210, there is no limitation to this configuration. If the mounted semiconductor integrated circuit does not require incident light, the semiconductor chip 220 may be protected by a protective material other than the cover glass 210, such as plastic.

Although an ultraviolet-curable resin is used as the adhesive 241, there is no limitation to this configuration. A material other than the ultraviolet-curable resin, such as a thermosetting resin described later, may be used as the adhesive.

Figure 4A:
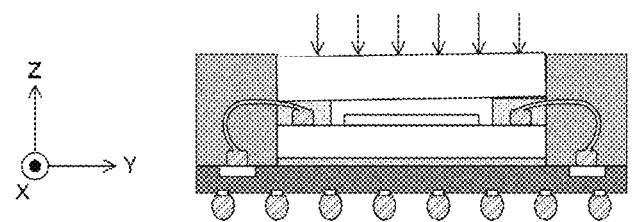
FIGS. 4A and 4B are examples of a cross-sectional view and a top view of a semiconductor package in a comparative example.
Figure 4B:
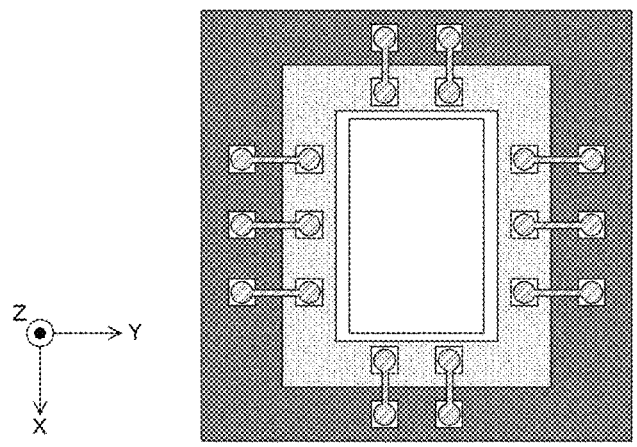

FIGS. 4A and 4B are examples of a cross-sectional view and a top view of a semiconductor package in a comparative example in which the support 251 is not provided. FIG. 4A is an example of a cross-sectional view of the semiconductor package of the comparative example, and FIG. 4B is an example of the top view of the semiconductor package of the comparative example.

As illustrated in FIGS. 4A and 4B, in the configuration in which the support 251 is not arranged, it is necessary to sufficiently increase the thickness (in other words, the height) of the adhesive in order to avoid damage to wires. Since the adhesive before curing is liquid, when the cover glass is placed on the adhesive in that state, the surface of the cover glass may be inclined with respect to the substrate plane. When the cover glass is inclined, the light incident on the cover glass may be refracted, and the image captured by the solid-state image sensor may be distorted due to the refraction of the light, resulting in deterioration of image quality.

To eliminate the inclination, for example, as described in WO 2008/032404 Specification, a thin layer of adhesive may be applied to a height (such as 20 μm) such that the cover glass is in contact with wires. However, in this configuration, the wires may come into contact with the cover glass. If the wires come into contact with the cover glass, the wires may be damaged or the increased stress on the wires may cause noise in electrical signals. The height of the cover glass becomes low, which may cause defects on the lower surface of the cover glass.

On the other hand, in the configuration in which the supports 251 are arranged, since the cover glass 210 can be supported at a position higher than the bumps 222, the cover glass 210 can be placed horizontally without the cover glass 210 coming into contact with the wires 129.

Semiconductor Package Manufacturing Method

Figure 5A:
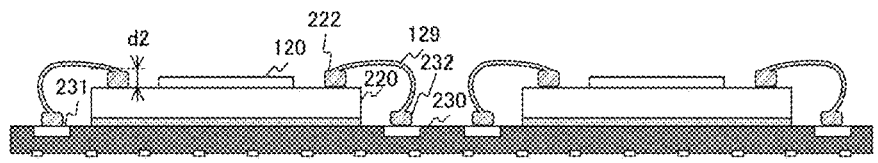
FIGS. 5A, 5B, 5C, and 5D are diagrams for explaining processes up to bonding of a cover glass in the first embodiment of the present technology.
Figure 5B:
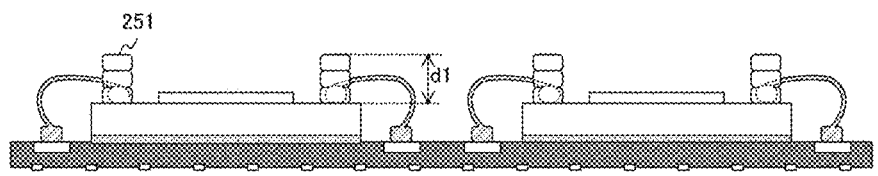
Figure 5C:
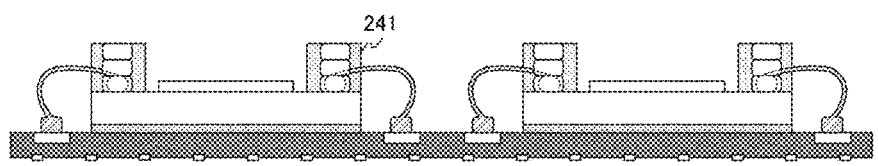
Figure 5D:
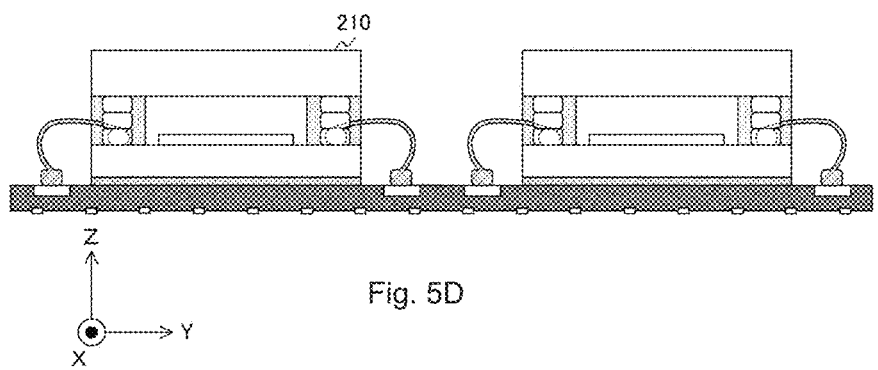

FIGS. 5A, 5B, 5C, and 5D is a diagram for explaining processes up to bonding of the cover glass 210 in the first embodiment of the present technology. FIG. 5A is a diagram for explaining a wire bonding process. FIG. 5B is a diagram for explaining the process of installing the supports 251. FIG. 5C is a diagram for explaining the process of applying the adhesive 241. FIG. 5D is a diagram for explaining a process of bonding the cover glass 210.

As illustrated in FIG. 5A, the manufacturing system of the semiconductor package 200 bonds the semiconductor chip 220 to the circuit substrate 230 by wire bonding. The height of the bumps 222 on the semiconductor chip 220 from the chip plane is d2. Subsequently, as illustrated in FIG. 5B, the manufacturing system installs the supports 251 at the four corners of the semiconductor chip 220. The height d1 of the supports 251 is higher than the height d2 of the bumps 222 as described above. The height d1 is set to a sufficiently large value so that the wires 129 do not come into contact with the supports 251.

As illustrated in FIG. 5C, the manufacturing system applies the adhesive 241 around the solid-state image sensor 120. It is assumed that an ultraviolet-curable resin is used as the adhesive 241. Subsequently, as illustrated in FIG. 5D, the manufacturing system mounts the cover glass 210 and cures the adhesive 241 (ultraviolet-curable resin) by irradiation with ultraviolet rays. As a result, the cover glass 210 is bonded to the semiconductor chip 220.

Figure 6A:
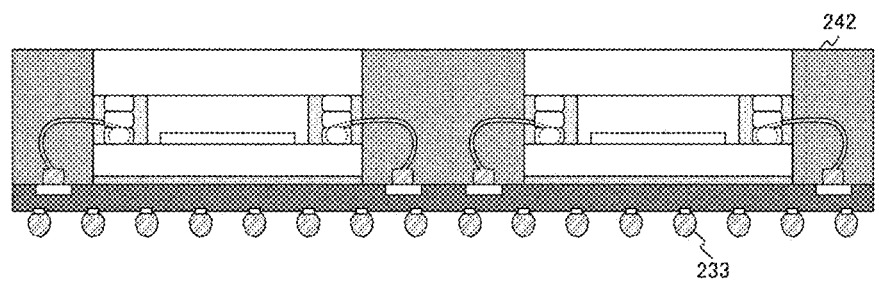
FIGS. 6A and 6B are diagrams for explaining processes up to fragmentation in the first embodiment of the present technology.
Figure 6B:
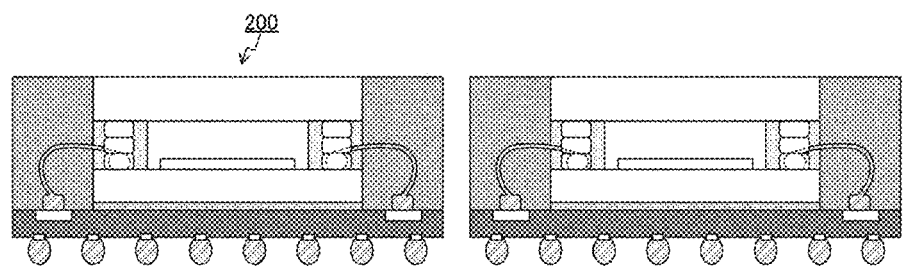

FIGS. 6A and 6B are diagrams for explaining processes up to fragmentation in the first embodiment of the present technology. FIG. 6A is a diagram for explaining a process of sealing and forming solder balls. FIG. 6B is a diagram for explaining a fragmentation step.

As illustrated in FIG. 6A, the manufacturing system pours the sealing resin 242 around the cover glass 210 and the semiconductor chip 220 in the substrate plane of the circuit substrate 230 and seals the sealing resin 242. The manufacturing system forms the solder balls 233 on the lower surface of the circuit substrate 230 so as to connect the semiconductor package 200 to the outside. As illustrated in FIG. 6B, the manufacturing system cuts the circuit substrate 230 and the like with a dicing saw or the like to fragment the same into a plurality of semiconductor packages 200.

Figure 7:
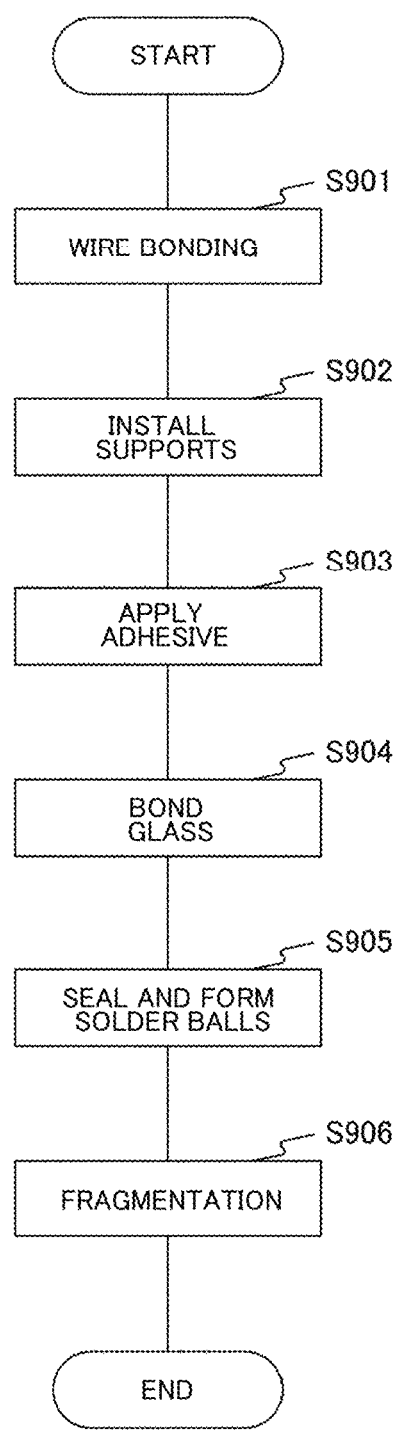
FIG. 7 is a flowchart illustrating an example of a semiconductor package manufacturing method according to the first embodiment of the present technology.

FIG. 7 is a flowchart illustrating an example of a method for manufacturing the semiconductor package 200 according to the first embodiment of the present technology. In the manufacturing system, the semiconductor chip 220 is bonded to the circuit substrate 230 by wire bonding (step S901), and the supports 251 are installed (step S902). The manufacturing system applies the adhesive 241 around the solid-state image sensor 120 (step S903), and bonds the cover glass 210 to the semiconductor chip 220 with the adhesive 241 (step S904).

Subsequently, the manufacturing system performs sealing with the sealing resin 242 and forms the solder balls 233 on the lower surface of the circuit substrate 230 (step S905). The manufacturing system cuts the circuit substrate 230 and the like with a dicing saw or the like to fragment the same into a plurality of semiconductor packages 200 (step S906).

As described above, according to the first embodiment of the present technology, since the supports 251 support the cover glass 210 at a position higher than the bumps 222, the cover glass 210 can be arranged horizontally without the cover glass 210 coming into contact with the wires 129. As a result, it is possible to eliminate the inclination of the cover glass 210 while preventing damage to the wires 129 due to contact with the cover glass 210 and generation of noise.

First Modification

In the above-described first embodiment, the ultraviolet-curable resin is used as the adhesive 241. However, the ultraviolet-curable resin generally has high light transmittance and reflectance. Therefore, the light having passed through the ultraviolet-curable resin or the light reflected by the ultraviolet-curable resin may be incident on the solid-state image sensor 120, which may cause flare or ghost in the image data. The semiconductor package 200 of the first modification of the first embodiment is different from that of the first embodiment in that a thermosetting resin is used as the adhesive.

Figure 8A:
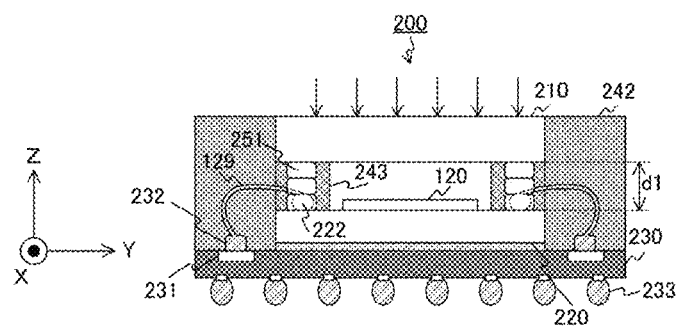
FIGS. 8A and 8B are examples of a cross-sectional view and a top view of a semiconductor package in a first modification of the first embodiment of the present technology.
Figure 8B:
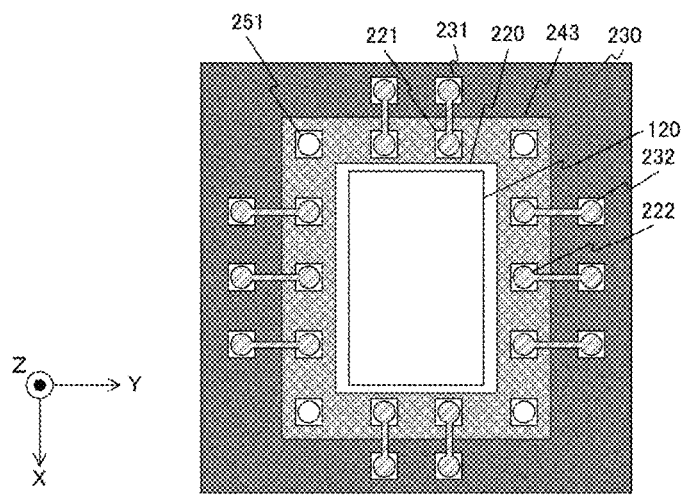

FIGS. 8A and 8B are examples of a cross-sectional view and a top view of the semiconductor package 200 in the first modification of the first embodiment of the present technology. FIG. 8A is an example of a cross-sectional view of the semiconductor package 200 in the first modification of the first embodiment, and FIG. 8B is an example of a top view of the semiconductor package 200 in the first modification of the first embodiment.

As illustrated in FIGS. 8A and 8B, the semiconductor package 200 of the first modification of the first embodiment is different from that of the first embodiment in that an adhesive 243 is applied instead of the adhesive 241. As the adhesive 243, for example, a thermosetting resin is used. This thermosetting resin has generally a color such as black having low transmittance and reflectance. By applying such a thermosetting resin around the solid-state image sensor 120, it is possible to suppress the occurrence of flare and the like.

Figure 9A:
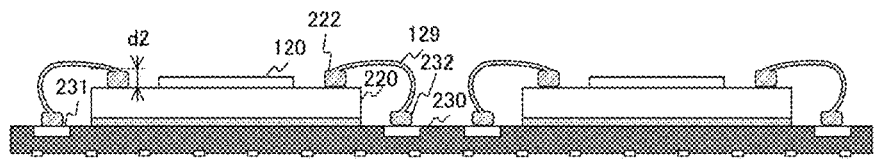
FIGS. 9A, 9B, 9C, and 9D are diagrams for explaining processes up to bonding of a cover glass in the first modification of the first embodiment of the present technology.
Figure 9B:
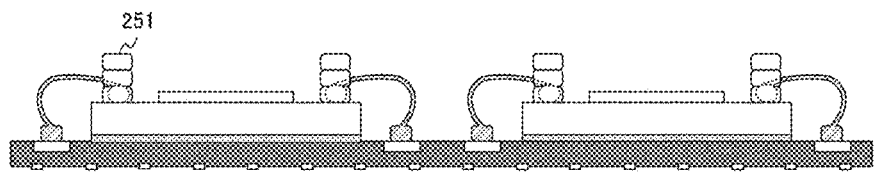
Figure 9C:
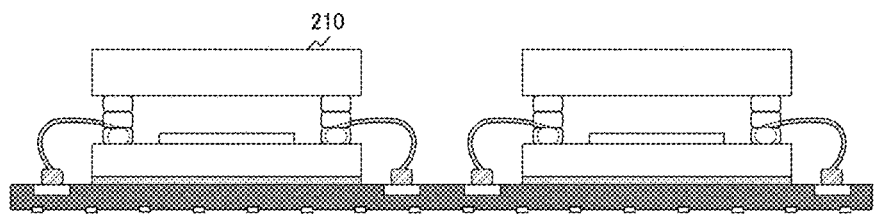
Figure 9D:
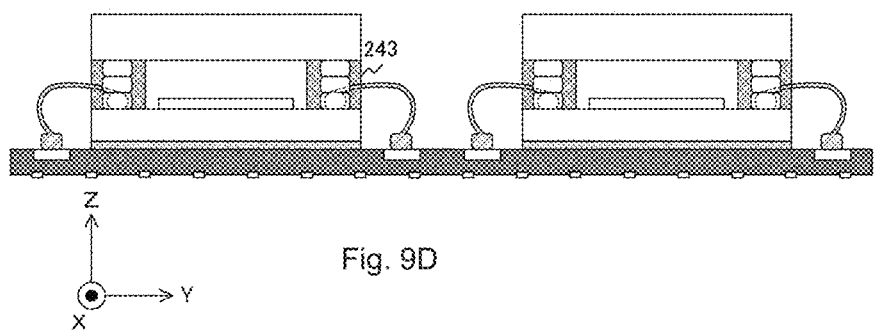

FIGS. 9A, 9B, 9C, and 9D are diagrams for explaining processes up to bonding of the cover glass 210 in the first modification of the first embodiment of the present technology. FIG. 9A is a diagram for explaining a wire bonding process. FIG. 9B is a diagram for explaining the process of installing the supports 251. FIG. 9C is a diagram for explaining a process of arranging the cover glass 210. FIG. 9D is a diagram for explaining a process of applying the adhesive 243.

As illustrated in FIG. 9A, the manufacturing system of the semiconductor package 200 bonds the semiconductor chip 220 to the circuit substrate 230 by wire bonding. Subsequently, as illustrated in FIG. 9B, the manufacturing system installs the supports 251 at the four corners of the semiconductor chip 220.

As illustrated in FIG. 9C, the manufacturing system arranges the cover glass 210. Subsequently, as illustrated in FIG. 9D, the manufacturing system applies a thermosetting resin as the adhesive 243 around the solid-state image sensor 120 on the chip plane and cures the same by heat treatment.

As described above, according to the first modification of the first embodiment of the present technology, since the thermosetting resin having low transmittance and reflectance is applied as the adhesive 243, it is possible to suppress the occurrence of flare and ghost that occurs due to the reflected light and the transmitted light.

Second Modification

In the first embodiment described above, the supports 251 are formed by laminating a plurality of stages of bumps, but the number of steps may increase as the number of bump stages increases. The semiconductor package 200 of the second modification of the first embodiment is different from that of the first embodiment in that the solder balls are arranged as supports.

Figure 10:
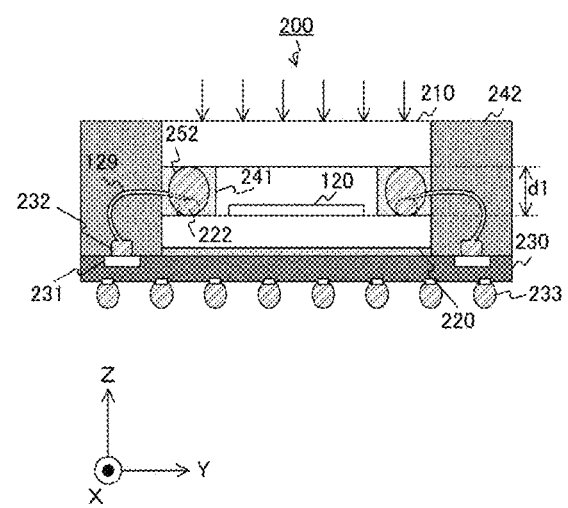
FIG. 10 is an example of a cross-sectional view of a semiconductor package in a second modification of the first embodiment of the present technology.

FIG. 10 is an example of a cross-sectional view of the semiconductor package 200 in the second modification of the first embodiment of the present technology. The semiconductor package 200 of the second modification of the first embodiment is different from that of the first embodiment in that supports 252 are arranged instead of the supports 251. Solder balls are used as the supports 252. The height of the solder balls is higher than that of the bumps 222 as in the first embodiment. By using the solder balls as the supports 252, the number of steps for forming the supports 252 can be reduced as compared with the first embodiment in which a plurality of bumps is laminated. Since the material of the solder balls is cheaper than the material of the bumps, the manufacturing cost can be reduced due to the use of solder balls.

The first modification can be applied to the second modification of the first embodiment.

As described above, according to the second modification of the first embodiment of the present technology, since the solder balls are arranged as the supports 252, the number of steps and the manufacturing cost can be reduced as compared with the case where a plurality of stages of bumps are arranged as the supports.

Third Modification

In the first embodiment described above, the supports 251 are formed by laminating a plurality of stages of bumps, but it is difficult to control the height with high accuracy by adjusting the number of bump stages. The semiconductor package 200 of the third modification of the first embodiment is different from that of the first embodiment in that copper posts are arranged as the supports.

Figure 11:
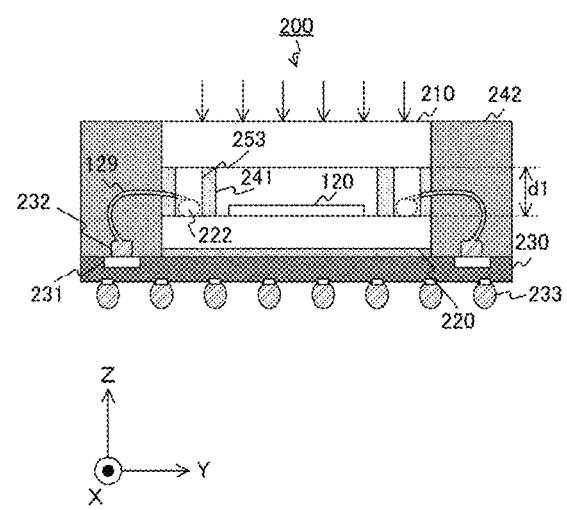
FIG. 11 is an example of a cross-sectional view of a semiconductor package in a third modification of the first embodiment of the present technology.

FIG. 11 is an example of a cross-sectional view of the semiconductor package 200 in the third modification of the first embodiment of the present technology. The semiconductor package 200 of the third modification of the first embodiment is different from that of the first embodiment in that supports 253 are arranged instead of the supports 251. Copper posts are used as the supports 253. The height of the copper posts is higher than the bumps 222 as in the first embodiment. The copper posts are columnar copper members, and are also referred to as copper pillars. The copper posts can be manufactured in a wafer process and their height variation can be controlled at the level of several micrometers (μm). Therefore, the height of the supports 253 can be controlled with high accuracy.

The first modification can be applied to the third modification of the first embodiment.

As described above, according to the third modification of the first embodiment of the present technology, since the copper posts are arranged as the supports 253, the height accuracy can be improved as compared with the case where a plurality of bumps are arranged as the supports.

Fourth Modification

In the first embodiment described above, the supports 251 are formed by laminating a plurality of stages of bumps, but it is difficult to control the height with high accuracy by adjusting the number of bump stages. The semiconductor package 200 of the fourth modification of the first embodiment is different from that of the first embodiment in that a dry film is arranged as the supports.

Figure 12:
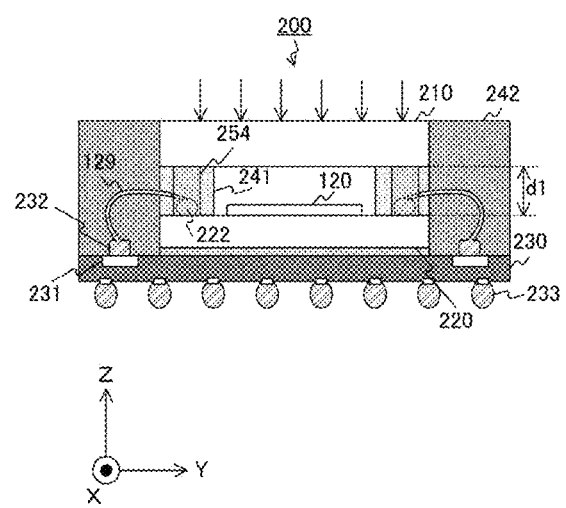
FIG. 12 is an example of a cross-sectional view of a semiconductor package in a fourth modification of the first embodiment of the present technology.

FIG. 12 is an example of a cross-sectional view of the semiconductor package 200 in the fourth modification of the first embodiment of the present technology. The semiconductor package 200 of the fourth modification of the first embodiment is different from that of the first embodiment in that supports 254 are arranged instead of the supports 251. A dry film is used as the supports 254. The height (in other words, the thickness) of the dry film is higher than that of the bumps 222 as in the first embodiment. The dry film is a photosensitive film formed of an emulsion layer, polyester, and an anti-halation layer. This dry film can be manufactured in a wafer process, and its thickness variation can be controlled at the level of several micrometers (μm). Therefore, the height of the supports 254 can be controlled with high accuracy.

The first modification can be applied to the fourth modification of the first embodiment.

As described above, according to the fourth modification of the first embodiment of the present technology, since the dry film is arranged as the supports 254, the height accuracy can be improved as compared with the case where a plurality of bumps are arranged as the supports.

2. Second Embodiment

In the first embodiment described above, the supports 251 are directly connected to the lower surface of the cover glass 210, but if the semiconductor chip 220 generates a large amount of heat, the heat may not be sufficiently dissipated. The semiconductor package 200 of the second embodiment is different from that of the first embodiment in that the heat dissipation performance is improved by providing electrodes on the lower surface of the cover glass 210 and connecting the supports 251 to the electrodes.

Figure 13:
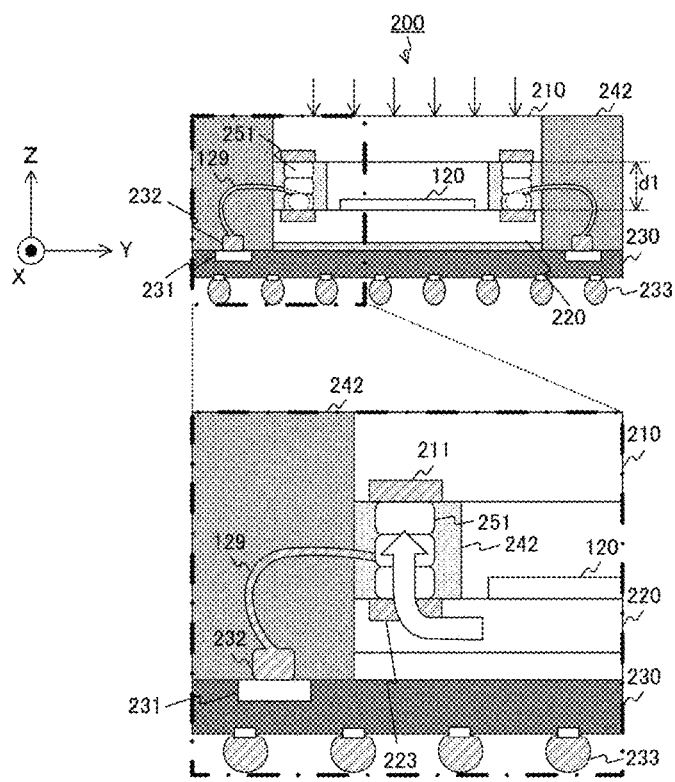
FIG. 13 is an example of a cross-sectional view of a semiconductor package according to a second embodiment of the present technology.

FIG. 13 is an example of a cross-sectional view of the semiconductor package 200 according to the second embodiment of the present technology. The semiconductor package 200 of this second embodiment is different from that of the first embodiment in that electrodes 211 and 223 are further formed.

The electrodes 211 are formed on the lower surface of the cover glass 210 at positions (the four corners and the like) where the supports 251 are arranged. The electrodes 223 are formed on the upper surface of the semiconductor chip 220 (that is, the surface of the chip) at positions (four corners and the like) where the supports 251 are arranged. The upper ends of the supports 251 are connected to the electrodes 211, and the lower ends are connected to the electrodes 223.

It is assumed that the material of the electrodes 211 and 223 is metal and does not transmit signals. These electrodes may be configured to transmit signals. In this case, a circuit (the DSP circuit 130 or the like) is connected to the electrodes 211 and 223. The signal lines connected to the upper electrodes 211 are wired, for example, to a path penetrating the cover glass 210.

The blank arrow in the drawing indicates the path through which heat is conducted. As illustrated in the drawing, the heat generated in the semiconductor chip 220 is conducted to the cover glass 210 via the electrodes 223, the supports 251 and the electrodes 211. Since the electrodes 223 and 211 are formed of metal, the electrodes have a higher thermal conductivity than the cover glass 210. Therefore, by adding these electrodes, it is possible to improve the performance of dissipating the heat generated in the semiconductor chip 220. Due to the improvement in the heat dissipation performance, it is possible to prevent warping of the semiconductor chip 220 and the circuit substrate 230 and malfunctioning of the circuits provided therein (such as the solid-state image sensor 120).

The first to third modifications can be applied to the second embodiment.

Figure 14:
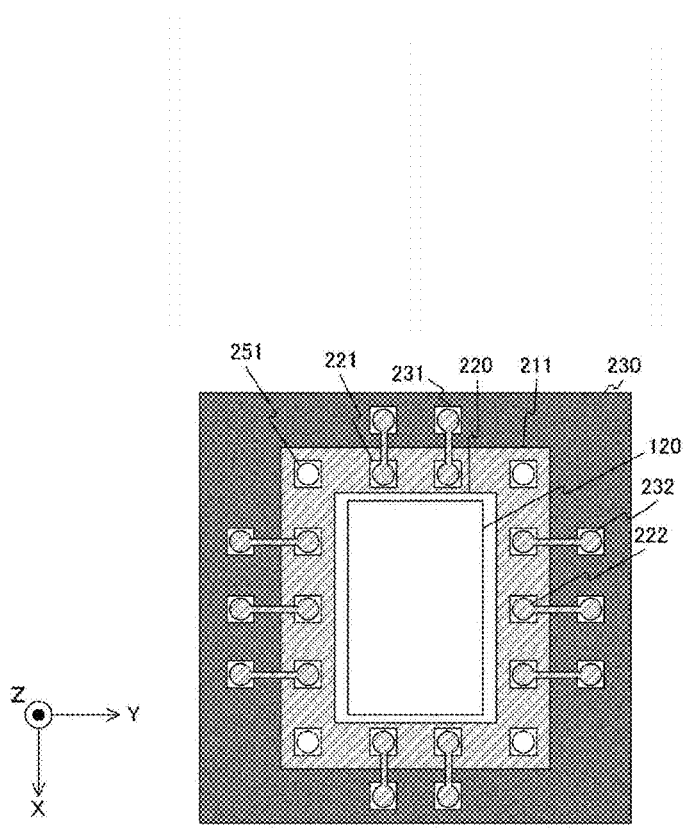
FIG. 14 is an example of a top view of a semiconductor package according to the second embodiment of the present technology.

By connecting the electrodes 223 to the ground, the electrodes 223 and 211 can function as an electromagnetic shield. In this case, as illustrated in FIG. 14, it is desirable to expand the area of the electrodes 223 and 211 by forming the electrodes 211 so as to cover the periphery of the solid-state image sensor 120.

As described above, according to the second embodiment of the present technology, since the electrodes 223 and 211 are provided and connected to the supports 251 it is possible to improve the performance of dissipating the heat generated in the semiconductor chip 220. As a result, it is possible to prevent warping of the semiconductor chip 220 and the circuit substrate 230 and malfunctioning of the circuits provided therein.

3. Third Embodiment

In the first embodiment described above, the supports 251 are directly connected to the lower surface of the cover glass 210, but since the adhesive 241 before curing is liquid, the position of the cover glass 210 in the X direction and the Y direction may deviate from a specified position. The semiconductor package 200 of the third embodiment is different from that of the first embodiment in that recesses 212 are formed in the cover glass 210 and the supports 251 are fitted into the recesses 212 to prevent misalignment.

Figure 15:
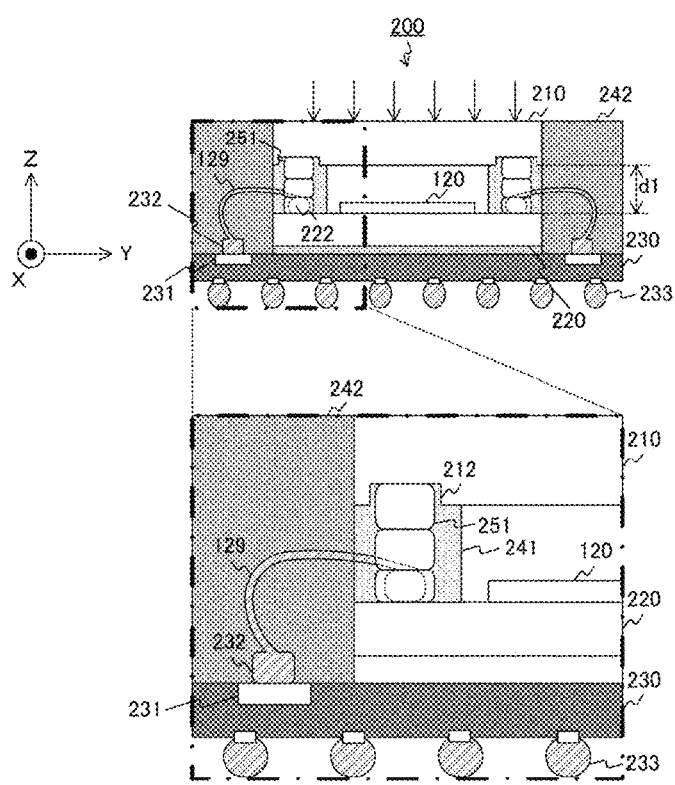
FIG. 15 is an example of a cross-sectional view of a semiconductor package according to a third embodiment of the present technology.

FIG. 15 is an example of a cross-sectional view of the semiconductor package 200 according to the third embodiment of the present technology. The semiconductor package 200 of the third embodiment is different from that of the first embodiment in that recesses 212 are formed in the lower surface of the cover glass 210.

The recesses 212 are formed in the lower surface of the cover glass 210 at positions (four corners or the like) where the supports 251 are arranged. The supports 251 are arranged such that the upper ends thereof are fitted into the recesses 212. As a result, it is possible to prevent misalignment of the cover glass 210 in the direction (X direction or Y direction) parallel to the substrate plane.

The first to fourth modifications can be applied to the third embodiment.

As described above, according to the third embodiment of the present technology, since one set of ends of the supports 251 are fitted into the recesses 212 of the cover glass 210, it is possible to prevent misalignment of the cover glass 210 in the direction parallel to the substrate plane.

4. Application Example to Moving Body

The technology (the present technology) according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

Figure 16:
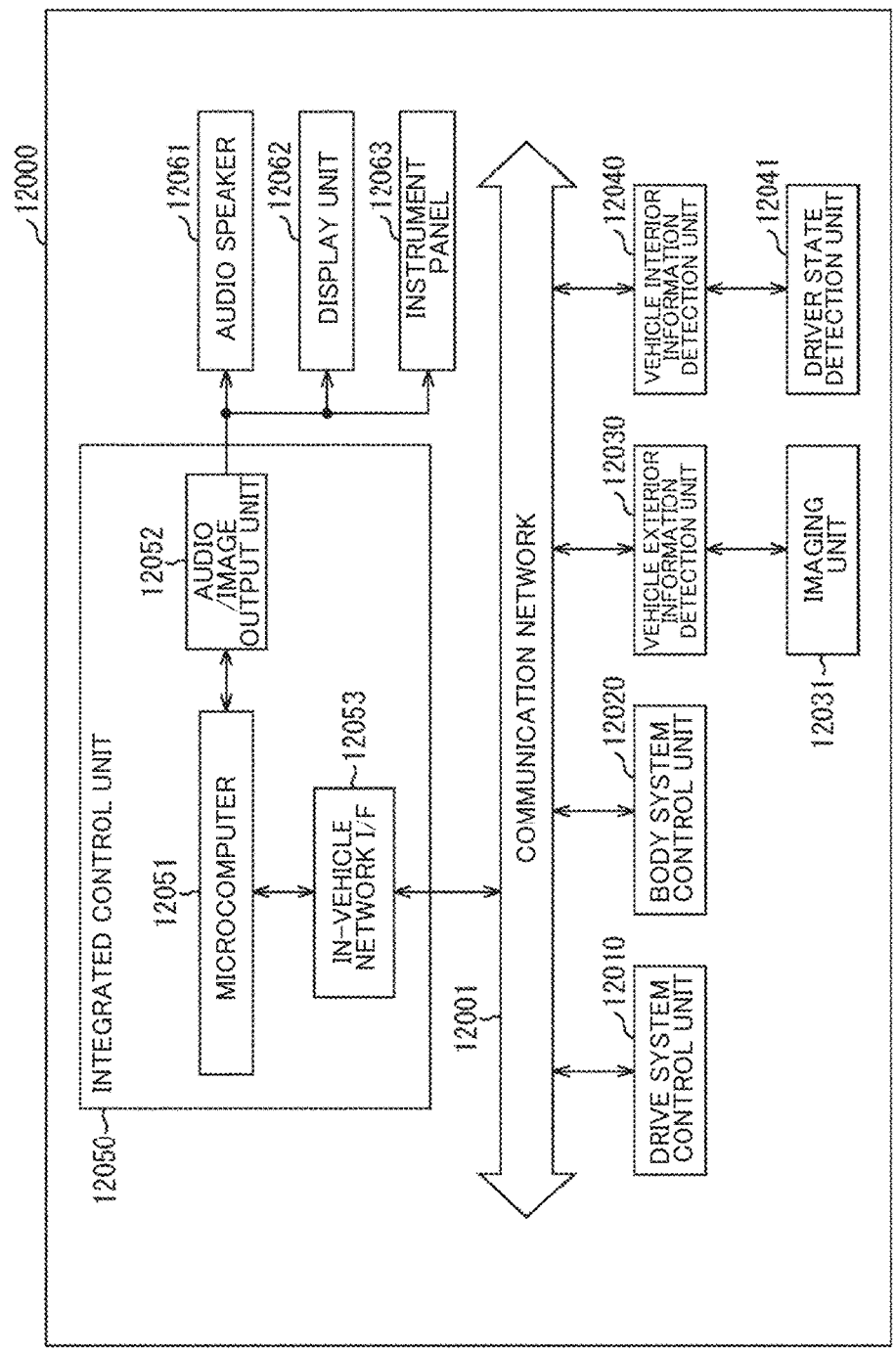
FIG. 16 is a block diagram illustrating a schematic configuration example of a vehicle control system.

FIG. 16 is a block diagram illustrating a schematic configuration example of a vehicle control system which is an example of a moving body control system to which the technology according to the present disclosure can be applied.

A vehicle control system 12000 includes a plurality of electronic control units connected via a communication network 12001. In the example illustrated in FIG. 16, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio/image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electrical signal corresponding to the amount of received light. The imaging unit 12031 can output the electrical signal as an image or can output the electrical signal as distance measurement information. Furthermore, the light received by the imaging unit 12031 may be visible light or invisible light such as infrared rays.

The vehicle interior information detection unit 12040 detects information inside the vehicle. For example, a driver state detection unit 12041 that detects a state of a driver is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether the driver is dozing off on the basis of the detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040, and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 can perform cooperative control for the purpose of automatic driving or the like in which the vehicle autonomously travels without depending on the operation of the driver by controlling the driving force generation device, the steering mechanism, the braking device, or the like on the basis of the information around the vehicle acquired by the vehicle exterior information detection unit 12030 or the vehicle interior information detection unit 12040.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio/image output unit 12052 transmits an output signal of at least one of a sound or an image to an output device capable of visually or audibly notifying an occupant of the vehicle or the outside of the vehicle of information. In the example of FIG. 16, an audio speaker 12061, a display unit 12062, and an instrument panel 12063 are illustrated as the output device. The display unit 12062 may include, for example, at least one of an on-board display and a head-up display.

Figure 17:
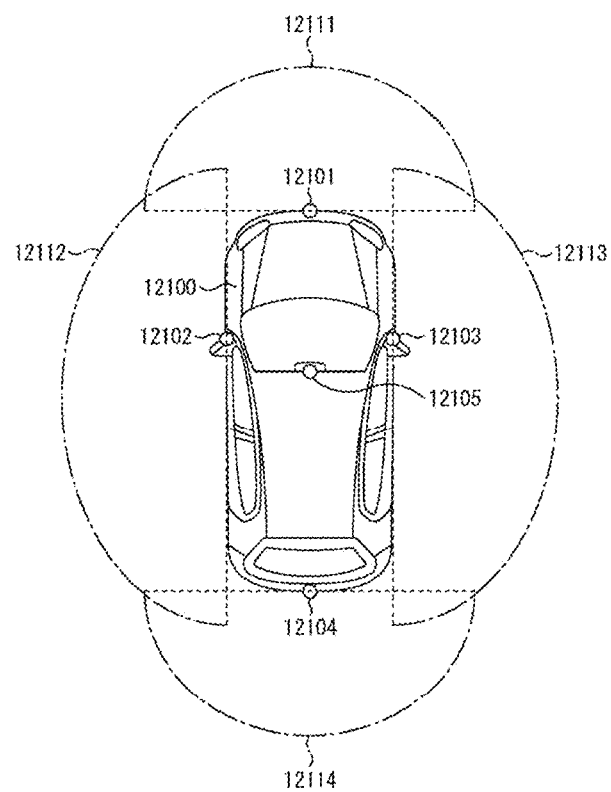
FIG. 17 is an explanatory diagram illustrating an example of an installation position of an imaging unit.

FIG. 17 is a diagram illustrating an example of an installation position of the imaging unit 12031.

In FIG. 17, imaging units 12101, 12102, 12103, 12104, and 12105 are provided as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images in front of the vehicle 12100. The imaging units 12102 and 12103 provided at the side mirrors mainly acquire images of the sides of the vehicle 12100. The imaging unit 12104 provided on the rear bumper or the back door mainly acquires an image behind the vehicle 12100. The front images acquired by the imaging unit 12105 is mainly used for detecting a preceding vehicle, a pedestrian, an obstacle, a traffic light, a traffic sign, a lane, or the like.

FIG. 17 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. The microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify and extract three-dimensional object data regarding three-dimensional objects into two-wheeled vehicles, ordinary vehicles, large vehicles, pedestrians, and other three-dimensional objects such as utility poles, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. The microcomputer 12051 determines a collision risk indicating a risk of collision with each obstacle, and when the collision risk is equal to or greater than a set value and there is a possibility of collision, the microcomputer 12051 can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether a pedestrian is present in the images captured by the imaging units 12101 to 12104. Such pedestrian recognition is performed by, for example, a procedure of extracting feature points in the images captured by the imaging units 12101 to 12104 as infrared cameras, and a procedure of performing pattern matching processing on a series of feature points indicating an outline of an object to determine whether the object is a pedestrian. When the microcomputer 12051 determines that a pedestrian is present in the images captured by the imaging units 12101 to 12104 and recognizes the pedestrian, the audio/image output unit 12052 controls the display unit 12062 to display a square contour line for emphasis to be superimposed on the recognized pedestrian. The audio/image output unit 12052 may control the display unit 12062 to display an icon or the like indicating a pedestrian at a desired position.

The example of the vehicle control system to which the technique according to the present disclosure is applied has been described above. The technology according to the present disclosure may be applied to the imaging unit 12031 and the like among the configurations described above. Specifically, the electronic device 100 in FIG. 1 can be applied to the imaging unit 12031. By applying the technology according to the present disclosure to the imaging unit 12031, since a captured image that is easy to see can be obtained due to prevention of inclination of the cover glass, the fatigue of a driver can be reduced.

The embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships.

However, the present technology is not limited to the embodiments, and can be embodied by subjecting the embodiments to various modifications without departing from the gist thereof.

The effects described in the specification are merely examples, and the effects of the present technology are not limited to them and may include other effects.

The present technology can also be configured as described below.

(1) A semiconductor package including: a substrate; a semiconductor chip laminated on the substrate; bumps provided on a chip plane of the semiconductor chip and connected to the substrate via wires; a protective material; and a support provided on the chip plane to support the protective material at a position where a height from the chip plane is higher than the bumps.

(2) The semiconductor package according to (1), in which electrodes are provided on each of the protective material and the semiconductor chip, and the support is connected to the electrodes.

(3) The semiconductor package according to (1), in which a recess is provided in the protective material and one end of the support is fitted into the recess.

(4) The semiconductor package according to any one of (1) to (3), further including an adhesive for bonding the protective material to the semiconductor chip.

(5) The semiconductor package according to (4), in which the adhesive is an ultraviolet-curable resin.

(6) The semiconductor package according to (4), in which the adhesive is a thermosetting resin.

(7) The semiconductor package according to any one of (1) to (6), in which the support is a laminated bump in which a plurality of bumps different from the bumps is laminated.

(8) The semiconductor package according to any one of (1) to (6), in which the support is a solder ball.

(9) The semiconductor package according to any one of (1) to (6), in which the support is a copper post.

(10) The semiconductor package according to any one of (1) to (6), in which the support is a dry film.

(11) The semiconductor package according to any one of (1) to (10), in which the protective material is a cover glass and a solid-state image sensor for capturing image data is further provided on the chip plane.

(12) A semiconductor package manufacturing method including: a connection procedure of connecting a substrate to bumps provided on a chip plane of a semiconductor chip laminated on the substrate; a support arrangement procedure of forming a support that supports a protective material at a position where a height from the chip plane is higher than the bumps on the chip plane; and a protective material arrangement procedure of arranging the protective material.

(13) The semiconductor package manufacturing method according to (12), further including: an application procedure of applying an ultraviolet-curable resin around a semiconductor integrated circuit on the chip plane after the support is formed, in which in the support arrangement procedure, the protective material is arranged after the ultraviolet-curable resin is applied to cure the ultraviolet-curable resin.

(14) The semiconductor package manufacturing method according to (12), further including an application procedure of applying a thermosetting resin around a semiconductor integrated circuit on the chip plane after the support is arranged.

(15) An electronic device including: a substrate; a semiconductor chip laminated on the substrate; bumps provided on a chip plane of the semiconductor chip and connected to the substrate via wires; a protective material; a support provided on the chip plane to support the protective material at a position where a height from the chip plane is higher than the bumps; and a signal processing circuit that processes signals generated by the semiconductor integrated circuit.

REFERENCE SIGNS LIST

100 Electronic device
110 Optical unit
120 Solid-state image sensor
130 DSP (Digital Signal Processing) circuit
140 Display unit
150 Operating unit
160 Bus
170 Frame memory
180 Recording unit
190 Power supply unit
200 Semiconductor package
210 Cover glass
211, 223 Electrode
212 Recess
220 Semiconductor chip
221, 231 Land
222, 232 Bump
230 Circuit substrate
233 Solder ball
241, 243 Adhesive
242 Sealing resin
251 to 254 Support
12031 Imaging unit

The invention claimed is:

1. A semiconductor package, comprising:
a substrate;
a semiconductor chip on the substrate, wherein the semiconductor chip includes a chip plane;
a plurality of wires;
a first plurality of bumps on the chip plane, wherein
  each of the first plurality of bumps has a first height from the chip plane, and
  each of the first plurality of bumps is connected to the substrate via the plurality of wires;
a protective material including:
  an upper surface on which light is incident; and
  a lower surface opposite to the upper surface, wherein the lower surface includes a recess; and
a support, including an end, on the chip plane, wherein
  the support is configured to support the protective material,
  the end is in the recess,
  the support has a second height from the chip plane, and
  the second height is higher than the first height.

2. The semiconductor package according to claim 1, further comprising:
  a first plurality of electrodes on the protective material; and
  a second plurality of electrodes on the semiconductor chip, wherein the support is connected to each of the first plurality of electrodes and the second plurality of electrodes.

3. The semiconductor package according to claim 1, further comprising:
  a semiconductor integrated circuit on the chip plane; and
  a plurality of supports around the semiconductor integrated circuit, wherein the plurality of supports includes the support.

4. The semiconductor package according to claim 1, further comprising an adhesive configured to bond the protective material to the semiconductor chip.

5. The semiconductor package according to claim 4, wherein the adhesive is an ultraviolet-curable resin.

6. The semiconductor package according to claim 4, wherein the adhesive is a thermosetting resin.

7. The semiconductor package according to claim 1, wherein
  the support further includes a second plurality of bumps, and
  the second plurality of bumps is laminated.

8. The semiconductor package according to claim 1, wherein the support is a solder ball.

9. The semiconductor package according to claim 1, wherein the support is a copper post.

10. The semiconductor package according to claim 1, wherein the support is a dry film.

11. The semiconductor package according to claim 1, wherein
  the protective material is a cover glass,
  the semiconductor package further comprises a solid-state image sensor on the chip plane, and
  the solid-state image sensor is configured to capture.

12. A semiconductor package manufacturing method, comprising:
connecting a substrate to a plurality of bumps, wherein
  a semiconductor chip is on the substrate,
  the semiconductor chip includes a chip plane,
  each of the plurality of bumps is on the chip plane, and
  each of the plurality of bumps has a first height from the chip plane;
forming a support configured to support a protective material, wherein
  the protective material includes:
    an upper surface on which light is incident, and
    a lower surface opposite to the upper surface,
  the lower surface includes a recess,
  the support includes an end,
  the end is in the recess,
  the support has a second height from the chip plane, and
  the second height is higher than the first height; and
arranging the protective material on the support.

13. The semiconductor package manufacturing method according to claim 12, further comprising:
applying an ultraviolet-curable resin around a semiconductor integrated circuit, wherein
  the semiconductor integrated circuit is on the chip plane,
  the ultraviolet-curable resin is applied after the support is formed, and
  the protective material is arranged after the ultraviolet-curable resin is applied; and
curing the ultraviolet-curable resin.

14. The semiconductor package manufacturing method according to claim 12, further comprising applying a thermosetting resin around a semiconductor integrated circuit, wherein
the semiconductor integrated circuit is on the chip plane, and
the thermosetting resin is applied after the support is arranged.

15. An electronic device, comprising:
a substrate;
a semiconductor chip on the substrate, wherein the semiconductor chip has a chip plane;
a semiconductor integrated circuit on the chip plane, wherein the semiconductor integrated circuit is configured to:
execute photoelectric conversion of light; and
generate a signal based on the execution of the photoelectric conversion;
a plurality of wires;
a first plurality of bumps on the chip plane, wherein
each of the first plurality of bumps has a first height from the chip plane, and
each of the first plurality of bumps are connected to the substrate via the plurality of wires;
a protective material including:
an upper surface on which light is incident; and
a lower surface opposite to the upper surface, wherein the lower surface includes a recess;
a support, including an end, on the chip plane, wherein
the support is configured to support the protective material,
the end is in the recess,
the support has a second height from the chip plane, and
the second height is higher than the first height; and
a signal processing circuit configured to process the signal generated by the semiconductor integrated circuit.

* * * * *